US012007646B2

(12) United States Patent
Wang et al.

(10) Patent No.: US 12,007,646 B2
(45) Date of Patent: Jun. 11, 2024

(54) LED DISPLAY DEVICE

(71) Applicants: EPISTAR CORPORATION, Hsinchu (TW); Yenrich Technology Corporation, Hsinchu (TW)

(72) Inventors: Chong-Yu Wang, Hsinchu (TW); Ching-Tai Cheng, Hsinchu (TW); Wei-Shan Hu, Hsinchu (TW)

(73) Assignees: EPISTAR CORPORATION, Hsinchu (TW); YENRICH TECHNOLOGY CORPORATION, Hsinchu (TW)

( * ) Notice: Subject to any disclaimer, the term of this patent is extended or adjusted under 35 U.S.C. 154(b) by 0 days.

(21) Appl. No.: 17/989,578

(22) Filed: Nov. 17, 2022

(65) Prior Publication Data

US 2023/0161196 A1 May 25, 2023

(30) Foreign Application Priority Data

Nov. 19, 2021 (TW) ................. 110143143

(51) Int. Cl.
*G02F 1/13357* (2006.01)
*H01L 25/075* (2006.01)
*H01L 25/13* (2006.01)
*H01L 33/60* (2010.01)

(52) U.S. Cl.
CPC .. *G02F 1/133605* (2013.01); *G02F 1/133603* (2013.01); *H01L 25/0753* (2013.01); *H01L 25/13* (2013.01); *H01L 33/60* (2013.01); *H01L 2933/0091* (2013.01)

(58) Field of Classification Search
CPC ........................................................ F21S 2/005
See application file for complete search history.

(56) References Cited

U.S. PATENT DOCUMENTS

| 2013/0265759 | A1* | 10/2013 | Chen ....................... H01L 33/60 362/235 |
| 2020/0083198 | A1  | 3/2020  | Kuo |
| 2020/0144229 | A1  | 5/2020  | Liu et al. |
| 2020/0341333 | A1* | 10/2020 | Qiu ....................... F21V 31/005 |
| 2021/0223627 | A1* | 7/2021  | Nam ................. G02F 1/133614 |
| 2021/0366414 | A1* | 11/2021 | Cheng ............... G02F 1/133606 |
| 2022/0313851 | A1* | 10/2022 | Subramanya ........... A61L 2/085 |

FOREIGN PATENT DOCUMENTS

| CN | 110676301 A | 1/2020 |
| CN | 113658984 A | 11/2021 |
| TW | I676851 B | 11/2019 |
| WO | WO-2021104445 A1 * | 6/2021 ........... G02B 6/0068 |

* cited by examiner

*Primary Examiner* — Karabi Guharay
(74) *Attorney, Agent, or Firm* — Patterson + Sheridan, LLP

(57) ABSTRACT

A display device includes a first light-emitting module and a second light-emitting module. Each light-emitting module has a substrate, a plurality of LED dies arranged on the substrate, a reflective layer on the substrate, and a light-transmissive layer. The light-transmissive layer covers the substrate, the plurality of LED dies, and the reflective layer. Both the light-transmissive layer of the first module and the light-transmissive layer of the second module have rough uppermost surfaces. The first light-emitting module has a first reflectivity, the second light-emitting module has a second reflectivity, and a standard deviation between the first reflectivity and the second reflectivity is not greater than 0.5.

11 Claims, 3 Drawing Sheets

| NO. of light-emitting module | reflectivity (%) | |
|---|---|---|
| | embodiment | comparison example |
| 1 | 85.2 | 83.41 |
| 2 | 84.3 | 83.11 |
| 3 | 85.2 | 83.51 |
| 4 | 84.9 | 83.05 |
| 5 | 85.4 | 82.58 |
| 6 | 85.1 | 82.77 |
| 7 | 84.2 | 82.29 |
| 8 | 85.2 | 83.97 |
| standard deviation of reflectivity | 0.447 | 0.542 |

FIG. 3

LED DISPLAY DEVICE

RELATED APPLICATION

This application claims the benefit of TW Application Serial No. 110143143, filed on Nov. 19, 2021, which are incorporated herein by reference in its entirety.

BACKGROUND

Technical Field

The present disclosure relates to a design for an LED display device, and, in particular, to an LED display device having a rough surface.

Description of the Related Art

Light-emitting diodes (LEDs) have certain properties, including low energy consumption, long lifetime, small volume, high response speed, and stable optical output. Therefore, LEDs have gradually replaced conventional light sources in various illuminating devices.

LED display devices have certain advantages, including high contrast and high brightness. The market demand for LED display devices is therefore increasing. As the market demand for LED display devices increases, there is a greater call for LED display devices of larger sizes. As a result, a technology for combining a plurality of LED modules into an LED display device has gradually developed. An LED display device adopting such configuration does not have a limitation on size. However, combining multiple modules has visual defects, such as visibly different colors between modules and splicing stripe.

SUMMARY

A display device includes a first light-emitting module and a second light-emitting module. Each light-emitting module has a substrate, a plurality of LED dies arranged on the substrate, a reflective layer on the substrate, and a light-transmissive layer. The light-transmissive layer covers the substrate, the plurality of LED dies, and the reflective layer. Both the light-transmissive layer of the first module and the light-transmissive layer of the second module have rough uppermost surfaces. The first light-emitting module has a first reflectivity, the second light-emitting module has a second reflectivity, and a standard deviation between the first reflectivity and the second reflectivity is not greater than 0.5.

BRIEF DESCRIPTION OF THE DRAWINGS

FIG. 3 is a table comparing the reflectivity of different light-emitting modules in accordance with an embodiment of the present disclosure and other comparison examples.

DETAILED DESCRIPTION

Figure 1:
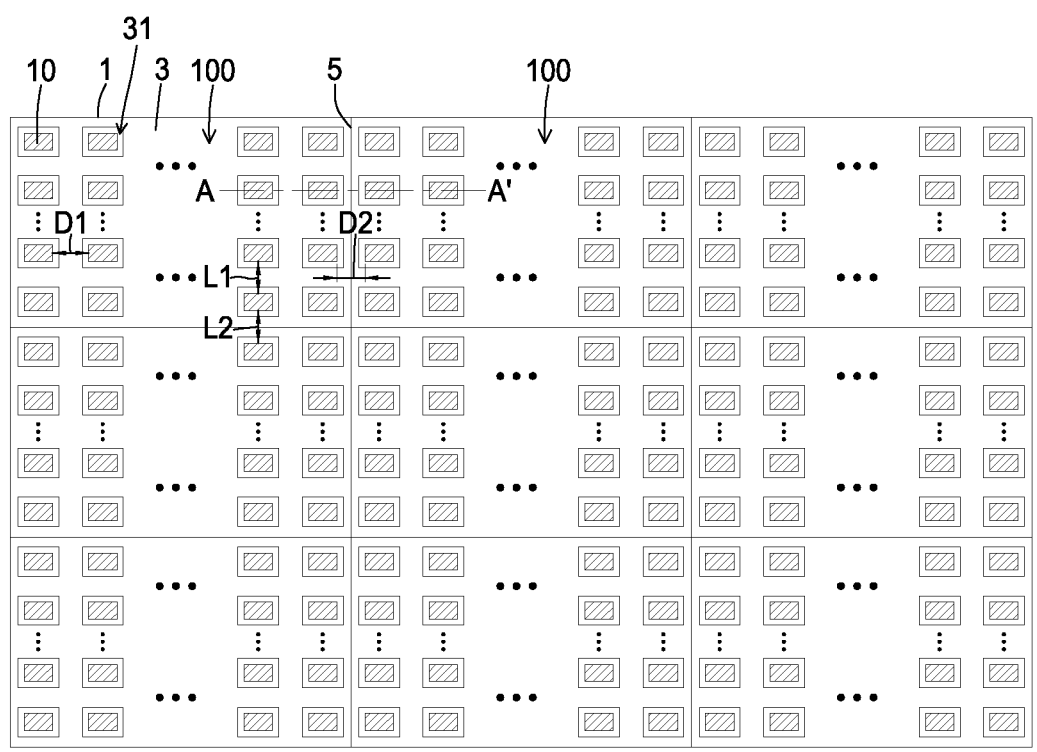
FIG. 1 is a schematic view showing a portion of the display device in accordance with an embodiment of the present disclosure.

Aspects of the present disclosure are understood from the following detailed description with the accompanying figures. In the drawings or descriptions, similar or identical parts are given the same reference numerals, and the shapes, thicknesses or heights of elements in the drawings may be increased or reduced within a reasonable range. The embodiments in the present disclosure are only used to illustrate the present disclosure, and are not intended to limit the scope of the present disclosure. Any obvious modifications or changes made to the present disclosure do not depart from the spirit and scope of the present disclosure.

FIG. 1 is a top view showing a portion of a display device 1000 in accordance with an embodiment of the present disclosure. The display device 1000 may be a backlight source of a liquid crystal display (LCD) monitor. The display device 1000 includes a plurality of light-emitting modules 100 arranged as an array to form the display device 1000. A splicing position 5 is between adjacent light-emitting modules 100. Each of the plurality of light-emitting modules 100 has a substrate 1, a reflective layer 3, a light-transmissive layer (not shown), and a plurality of LED dies 10 arranged as an array on the substrate 1. The reflective layer 3 is on the substrate 1 and has a plurality of openings 31. The opening 31 has a width greater than that of the LED die 10. The plurality of LED dies 10 is in the plurality of openings 31 of the reflective layer 3 and electrically connected to circuits (not shown) of the substrate 1 to be controlled by internal and/or external driving device (not shown) to emit lights. In an embodiment, the multiple LED dies 10 in the display device 1000 emit light with an identical color. And, the display device 1000 includes two or more independent wavelength conversion layers (not shown) above two or more LED dies 10 to allow the display device 1000 emitting colors such as red, blue, and green. In an embodiment, the wavelength conversion layer can be a quantum dot (QD) film. For example, the LED dies 10 emit blue light, wherein a portion of the LED dies 10 are covered by wavelength conversion layers that can be excited by the blue light to emit green light, a portion of the LED dies 10 are covered by wavelength conversion layers that can be excited by the blue light to emit red light, and the rest of the LED dies 10 are not covered by any wavelength conversion layer. In another embodiment, the LED dies 10 emit ultraviolet light, wherein a portion of the LED dies 10 are covered by wavelength conversion layers that can be excited by the ultraviolet light for emit blue light, a portion of the LED dies 10 are covered by wavelength conversion layers that can be excited by the ultraviolet light for emit green light, and the rest portion of the LED dies 10 are covered by wavelength conversion layers that can be excited by the ultraviolet light for emit red light.

In a single light-emitting module 100, a lateral distance between two adjacent LED dies is DL. In two adjacent light-emitting modules 100, a lateral distance between two adjacent LED dies which are respectively located in different light-emitting modules 100 is D2. In a single light-emitting module 100, a longitudinal distance between two adjacent LED dies is L1. In two adjacent light-emitting modules 100, a longitudinal distance between two adjacent LED dies which are respectively located in different light-emitting modules 100 is L2. In an embodiment, to prevent the splicing position of adjacent modules from creating a sense of discontinuity in human vision, D1 is preferably equal to D2, and L1 is preferably equal to L2. In other words, the plurality of LED dies 10 in the display device 1000 are arranged on the substrate 1 at equal distances.

Figure 2:
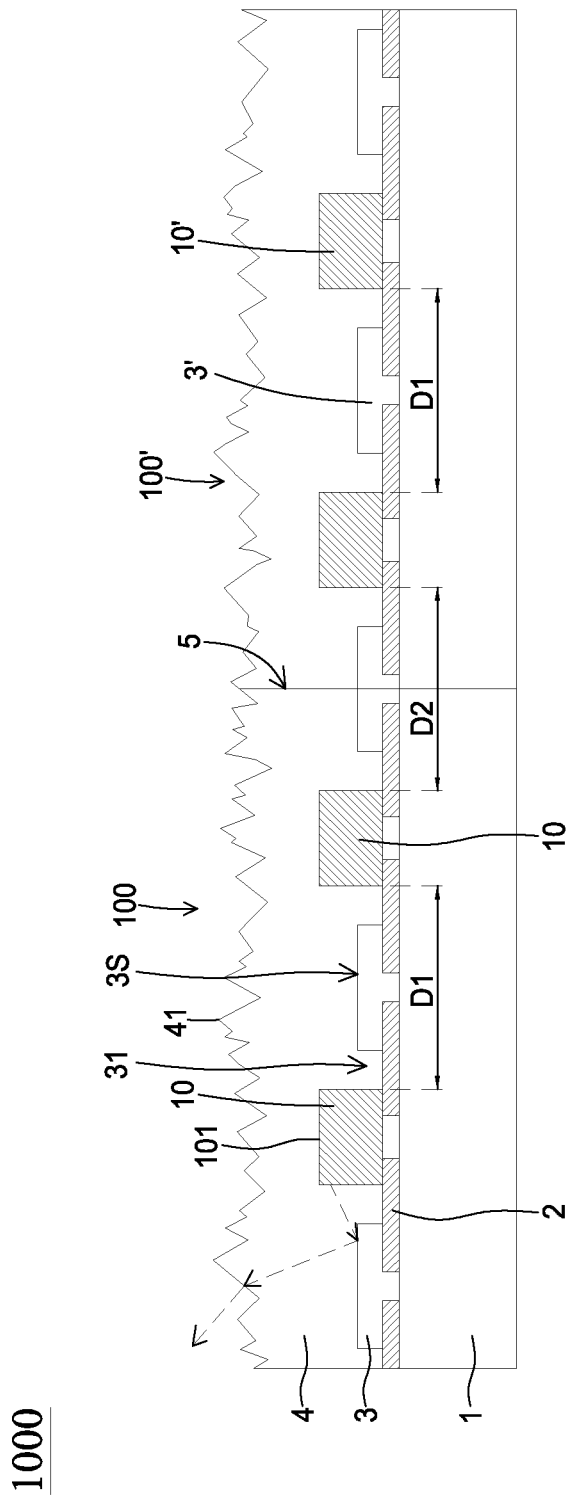
FIG. 2 is a cross-sectional view showing a portion of the display device in accordance with an embodiment of the present disclosure.

FIG. 2 is a cross-sectional view of the display device 1000 illustrated along line A-A' shown in FIG. 1. The line A-A' extends across the splicing position 5. In FIG. 2, the light-emitting module 100 is at the left side of the splicing position 5, and the light-emitting module 100' is at the right side of the splicing position 5 for convenience of explanation. Taking the light-emitting module 100 as an example, the light-emitting module 100 has a substrate 1, a conductive circuit 2, a reflective layer 3, a plurality of LED dies 10, and a light-transmissive layer 4. The maximum thickness of the entire light-emitting module 100 is less than 600 μm, and preferably less than 500 μm. The conductive circuit 2 is above the substrate 1 and electrically connected to the plurality of LED dies 10. The plurality of LED dies 10 are equally spaced apart from each other by D1 to make the light uniformly emitted by the light-emitting module 100. The reflective layer 3 is above the conductive circuit 2 and has a plurality of openings 31. The openings 31 expose a portion of the conductive circuit 2, and at least one LED die 10 is disposed in each of the openings 31 to electrically connect to the exposed conductive circuit 2. The reflective layer 3 may reflect the light emitted by the LED dies 10 to the substrate 1, so the light may be reflected upward to increase the brightness of the light-emitting module 100. The uppermost surface 3S of the reflective layer 3 is preferably lower than the uppermost surface 101 of the LED die 10, so the light emitted from the edge of the LED die 10 may not be blocked by the reflective layer 3. It is worth noting that the reflective layer 3 and the LED die 10 are laterally separated from each other and spaced apart by a distance, so the reflective layer 3 may be prevented from covering excessive conductive circuit 2 because of manufacturing tolerance, which may cause the LED dies 10 to be unable to or partially able to connect to the conductive circuit 2. Moreover, the reflective layer 3 is not in direct contact with the side surface of the LED die 10, so the LED die 10 may emit light from the side surface to increase the brightness of the light-emitting module 100.

Referring to FIG. 2, the light-transmissive layer 4 is above the substrate 1 and covers the plurality of LED dies 10, the reflective layer 3, and the conductive circuit 2 to protect the LED dies 10 and the conductive circuit 2. A rough uppermost surface 41 of the light-transmissive layer 4 is a rough surface having a plurality of protruding portions and a plurality of concave portions. The roughness of the rough uppermost surface 41 of the light-transmissive layer 4 is greater than the roughness of the uppermost surface 3S of the reflective layer 3. The rough uppermost surface 41 of the light-transmissive layer 4 may reduce total internal reflection of the light emitted by the LED dies 10 occurring at the rough uppermost surface 41, wherein the total internal reflection causes the light back to the substrate 1 to be absorbed and loss. In other words, the rough uppermost surface 41 of the light-transmissive layer 4 helps the light emitted from the LED dies 10 being refracted at the rough uppermost surface 41 to leave the light-emitting module 100 for increasing the brightness of the light-emitting module 100. Moreover, the rough uppermost surface 41 of the light-transmissive layer 4 may disperse reflected light generated by ambient light entering into the light-emitting module 100 and reflected by the reflective layer 3, so the uncomfortable feeling in the human eye caused by the reflected light can be reduced.

The LED dies 10 in the light-emitting module 100 and the LED dies 10' in the light-emitting module 100' have similar luminous wavelength and/or intensity. For example, the maximum difference between the light emission dominant wavelength/peak wavelength of a LED die 10 in the light-emitting module 100 and that of a LED die 10' in the light-emitting module 100' is less than or equal to 1.5 nm. And, the maximum variation of luminous intensity of the LED die 10 and the LED die 10' is less than or equal to 3.5%, wherein the variation of luminous intensity is a ratio of the difference between the luminous intensity of the LED die 10 and the LED die 10' to the luminous intensity of the worse of the LED die 10 and the LED die 10'. Usually, there is difference in reflectivity between the reflective layer 3 in the light-emitting module 100 and the reflective layer 3' in the light-emitting module 100' due to process tolerances. The difference in reflectivity causes the light intensity of the light from the LED dies 10 reflected by the reflective layer 3 to be different from the light intensity of the light from the LED dies 10' reflected by the reflective layer 3'. The rough uppermost surface 41 of the light-transmissive layer 4 may refract and scatter the light from the reflective layer 3 and the reflective layer 3', thereby reducing the difference in light intensity between different light-emitting modules 100, 100' due to the difference in the reflectivity between the reflective layer 3 and the reflective layer 3'. Thus, the probability that the human eye perceives splicing stripes (splicing positions) caused by inconsistent colors between adjacent light-emitting modules 100, 100' can be reduced.

The substrate 1 may include organic material, inorganic material, or a combination thereof. The substrate 1 may be bendable (and may be restored to its original shape when the stress is removed) or not bendable. The organic material may include phenolic resin, glass fiber, epoxy resin, polyimide, bismaleimide triazine (BT), or ABF (Ajinomoto Build-up Film). The inorganic material may include aluminum, ceramic material, or glass. The bendable materials may include polyethylene terephthalate (PET), polyimide (PI), polyvinylidene fluoride (HPVDF), or ethylene-tetrafluoro-ethylene (ETFE).

The light-transmissive layer 4 may be penetrated by all or part of the light emitted by the LED dies 10, and the material of the light-transmissive layer 4 may include silicone, epoxy, polyimide (PI), benzocyclobutene (BCB), perfluorocyclobutane (PFCB), SU8, acrylic resin, polymethyl methacrylate (PMMA), polyethylene terephthalate (PET), polyethylene carbonate (PC), polyetherimide, fluorocarbon polymer, alumina ($Al_2O_3$), SINR, or spin-on glass (SOG). In an embodiment, the raw material of the light-transmissive layer 4 is a film that can be attached to the substrate 1 (hereinafter referred to as "lamination"), which has the advantages of uniform thickness and thinness. In an embodiment, the thickness of the light-transmissive layer 4 is less than 200 μm or less than 150 μm. In another embodiment, the light-transmissive layer 4 is formed on the light-emitting module 100 by dispensing, spraying, etc., and the thickness of different light-emitting modules 100 may vary slightly. However, the difference between the thicknesses of the light-emitting modules 100 may be reduced by lamination. For example, the standard deviation of the thickness of several light-emitting modules 100 is not greater than 0.01. In another embodiment, the light-transmissive layer 4 may contain carbon black particles, which can absorb the ambient light or the ambient light penetrating the light-transmissive layer 4 and reflected by the reflective layer 3 for increasing the contrast of the display device 1000/the light-emitting module 100.

The reflective layer 3 may include a mixture of a base material and a high reflectivity material. The base material may be silicone-based or epoxy-based material. The high reflectivity material may include titanium dioxide, silicon dioxide, aluminum oxide, $K_2TiO_3$, $ZrO_2$, ZnS, ZnO, or MgO.

The LED die 10 is a semiconductor light-emitting element, which includes a first semiconductor layer, a second semiconductor layer, and an active layer between the first semiconductor layer and the second semiconductor layer. The first semiconductor layer and the second semiconductor layer may respectively provide electrons and holes so that the electrons and holes are recombined in the active layer to emit light. The first semiconductor layer, the active layer, and the second semiconductor layer may include III-V semiconductor materials, such as $Al_xIn_yGa_{(1-x-y)}N$ or $Al_{x^-}In_yGa_{(1-x-y)}P$, where $0 \leq x$, $y \leq 1$; $(x+y) \leq 1$. Based on the material of the active layer, the LED die 10 can emit a red light with a peak value between 610 nm and 650 nm, a green light with a peak value between 530 nm and 570 nm, a blue light with a peak value between 450 nm and 490 nm, a purple light with a peak value between 400 nm and 450 nm, or ultraviolet with a peak value between 280 nm and 400 nm. In another embodiment, the LED die 10 may be replaced with a laser diode.

In an embodiment, the LED die 10 may be a flip chip, and each of the LED dies 10 may be affixed on the conductive circuit 2 by conductive materials (not shown) such as solder or anisotropic conductive adhesive. In one embodiment, the LED die 10 is a vertical chip, and the adhesive material can be solder, anisotropic conductive adhesive, or the like. In another embodiment, the LED die 10 is a horizontal chip, and the adhesive material can be silver glue, epoxy resin, silicon glue, or the like.

In another embodiment, the light-emitting module 100 may be applied for illumination or a display (directly used as a pixel). The LED dies 10 may be red LED dies, green LED dies, blue LED dies, and/or cyan LED dies based on requirement. For example, when the LED dies are used for illumination and/or backlight sources, the LED dies 10 may be blue LED dies (blue light-emitting diodes may emit white light with appropriate phosphors). Furthermore, when the LED dies 10 are used in displays, the LED dies 10 may include blue, red, and green LED dies, or include red, green, blue, and cyan LED dies.

The display device 1000 includes a plurality of light-emitting modules 100. And, the rough uppermost surfaces 41 of the light-transmissive layers 4 are able to solve problems such as uneven brightness, inconsistent colors, and splicing stripes between different light-emitting modules. A reflectivity may be measured above each of the light-emitting modules 100, and the reflectivity is the sum of the reflectivity of the light-transmissive layer 4 of the light-emitting module 100 and the reflectivity of the reflective layer 3 below the light-transmissive layer 4. There is a standard deviation between the reflectivities of the light-emitting modules 100, and the standard deviation is not greater than 0.5. Namely, the reflectivity dispersion of the light-emitting modules 100 is not high, and the human eye is less likely to perceive the difference in luminance among different light-emitting modules, so the display device 1000 with better display effect may be obtained.

FIG. 3 is a table showing the reflectivities of different light-emitting modules according to the embodiment and the comparison example. The difference between the light-emitting modules in the embodiment and those in the comparison example is the roughness of the upper surface of the light-transmissive layer. In the embodiment, the light-transmissive layer 4 of the light-emitting module 100 has a rough uppermost surface with roughness between 10 μm and 30 μm. In the comparison example, the light-transmissive layers of the light-emitting modules have smooth upper surfaces (not shown) with roughness smaller than 5 μm. The reflectivity is measured by a portable sphere spectrophotometer (such as a Ci6X manufactured by X-Rite) disposed above each of the light-emitting modules. The portable sphere spectrophotometer emits a light with 450 nm wavelength to each light-emitting module, and the light reflected by each light-emitting module is back to and measured by the portable sphere spectrophotometer to calculate the reflectivity. As shown in FIG. 3, in the embodiment and comparison example, 8 different levels of reflectivity are measured in 8 light-emitting modules 100 with the light-transmissive layer having different roughness according to the embodiment, and 8 light-emitting modules with smooth upper surfaces of the light-transmissive layer having different roughness according to comparison example, which are numbered 1, 2, 3, 4, 5, 6, 7, and 8 respectively. In the embodiment, the reflectivities vary because the rough surfaces of the light-transmissive layers 4 have different roughness, and the reflectivities of the light-emitting modules 100 are between 84% and 86%. In the embodiment, the standard deviation of reflectivities among different light-emitting modules 100 with rough upper surfaces is 0.447.

In the comparison example, the light-transmissive layers of the light-emitting modules (which are numbered 1, 2, 3, 4, 5, 6, 7, and 8) have smooth upper surfaces. 8 different levels of reflectivity may be measured, which range from 82% to 84% with a standard deviation of 0.542.

As shown in the table of FIG. 3, the standard deviation of the reflectivities of the light-emitting modules 100 in the embodiment is lower (the dispersion is lower), and the standard deviation of that of the light-emitting modules according to the comparison example is higher (the dispersion is higher). Therefore, the brightness and color uniformity of the display device assembled by the light-emitting modules 100 in the embodiment are better than those of the display device assembled by the light-emitting modules in comparison example.

The above-mentioned embodiment is only for illustrating the technical idea and characteristics of the present disclosure, and its purpose is to enable those who are familiar with the art to understand the content of the present disclosure and implement accordingly, of course it cannot be used to limit the present disclosure. The scope of the claims, that is, all equivalent changes or modifications made according to the spirit disclosed in the present disclosure should still be covered within the scope of the claims of the present disclosure.

What is claimed is:

1. A display device, comprising:
   a first light-emitting module, comprising a first substrate, a plurality of first LED dies disposed on the first substrate, a first reflective layer on the first substrate, and a first light-transmissive layer covering the first substrate, the plurality of first LED dies, and the first reflective layer; and
   a second light-emitting module, comprising a second substrate, a plurality of second LED dies disposed on the second substrate, a second reflective layer on the second substrate, and a second light-transmissive layer covering the second substrate, the plurality of second LED dies, and the second reflective layer,
   wherein the first light-transmissive layer has a first rough uppermost surface, and the second light-transmissive layer has a second rough uppermost surface,
   wherein the first light-emitting module has a first reflectivity, the second light-emitting module has a second reflectivity, and a standard deviation between the first reflectivity and the second reflectivity is not greater than 0.5, wherein the first light-emitting module and the second light-emitting module have a splicing position between thereof, wherein the first light-transmissive layer is directly attached to the plurality of first LED dies and the first reflective layer, and the second light-transmissive layer is directly attached to the plurality of second LED dies and the second reflective layer, and wherein the first rough uppermost surface and the second rough uppermost surface have different roughnesses.

2. The display device as claimed in claim 1, wherein the first light-emitting module has a first thickness, the second light-emitting module has a second thickness, and a standard deviation between the first thickness and the second thickness is not greater than 0.01.

3. The display device as claimed in claim 1, wherein the plurality of first LED dies is arranged in equal pitches.

4. The display device as claimed in claim 1, wherein the first reflective layer is not in contact with the plurality of first LED dies and the plurality of second LED dies.

5. The display device as claimed in claim 1, wherein the first light-emitting module further comprises a first conductive circuit between the first reflective layer and the first substrate, and the first conductive circuit is electrically connected to the plurality of first LED dies.

6. The display device as claimed in claim 1, wherein the first reflective layer has a first uppermost surface, one of the plurality of first LED dies has a second uppermost surface, the first uppermost surface is lower than the second uppermost surface.

7. The display device as claimed in claim 1, wherein the first reflective layer has an opening, one of the plurality of first LED dies is disposed in the opening, and a width of the opening is greater than a width of the one of the plurality of first LED dies.

8. The display device as claimed in claim 1, wherein the first light-transmissive layer has a thickness less than 150 µm.

9. The display device as claimed in claim 1, wherein a maximum thickness of the first light-emitting module is less than 600 µm.

10. The display device as claimed in claim 1, wherein the plurality of first LED dies and the plurality of second LED dies are configured to emit a same color light.

11. The display device as claimed in claim 1, wherein the first rough uppermost surface and the second rough uppermost surface each have a roughness between 10 µm and 30 µm.

* * * * *